US008796136B2

(12) United States Patent
Sugiyama et al.

(10) Patent No.: US 8,796,136 B2
(45) Date of Patent: Aug. 5, 2014

(54) SEMICONDUCTOR DEVICE AND MANUFACTURING METHOD THEREOF

(75) Inventors: Satoru Sugiyama, Tokyo (JP); Yuuta Nishioka, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 29 days.

(21) Appl. No.: 13/435,403

(22) Filed: Mar. 30, 2012

(65) Prior Publication Data

US 2012/0248581 A1    Oct. 4, 2012

(30) Foreign Application Priority Data

Mar. 31, 2011    (JP) .................................. 2011-079612

(51) Int. Cl.
*H01L 21/3205* (2006.01)
(52) U.S. Cl.
USPC ........... 438/635; 438/667; 438/672; 438/700; 257/E21.577; 257/E21.585
(58) Field of Classification Search
CPC ..................... H01L 21/76831; H01L 21/76898
USPC ........... 257/774, E23.011, E23.067, E23.145, 257/E23.174, E21.577, E21.578, E21.585, 257/E21.58; 438/430, 431, 435, 629, 637, 438/639, 640, 667, 672, 700, 425, 444, 635
See application file for complete search history.

(56) References Cited

U.S. PATENT DOCUMENTS

| 5,897,361 | A   | * | 4/1999  | Egawa          | 438/435 |
| 5,960,317 | A   | * | 9/1999  | Jeong          | 438/633 |
| 7,943,470 | B2  |   | 5/2011  | Uchiyama       |         |
| 8,004,090 | B2  |   | 8/2011  | Uchiyama       |         |
| 8,216,936 | B1  | * | 7/2012  | Rahman         | 438/667 |
| 8,440,565 | B2  | * | 5/2013  | Muta           | 438/667 |
| 2001/0030344 | A1 | * | 10/2001 | Shimomura et al. | 257/324 |
| 2006/0166514 | A1 | * | 7/2006  | Cheng et al.   | 438/788 |
| 2007/0259522 | A1 | * | 11/2007 | Arai et al.    | 438/672 |
| 2011/0193242 | A1 |   | 8/2011  | Uchiyama       |         |
| 2011/0195572 | A1 |   | 8/2011  | Uchiyama       |         |
| 2011/0254165 | A1 | * | 10/2011 | Muranaka       | 438/637 |
| 2012/0015113 | A1 | * | 1/2012  | Hua et al.     | 427/579 |
| 2012/0074582 | A1 | * | 3/2012  | Yu et al.      | 438/637 |

FOREIGN PATENT DOCUMENTS

| JP | 2008-251964 A | 10/2008 |
| JP | 2009-111061 A | 5/2009  |

* cited by examiner

*Primary Examiner* — Fernando L Toledo
*Assistant Examiner* — Christine C Lau
(74) *Attorney, Agent, or Firm* — Foley & Lardner LLP

(57) ABSTRACT

A semiconductor device is provided, which includes an annular insulation separation portion penetrating a semiconductor substrate, and an electrode penetrating the semiconductor substrate in a region surrounded by the annular insulation separation portion, wherein the insulation separation portion includes at least a first film that gives compressive stress in a depth direction on the side of a substrate, a second film that gives tensile stress in the depth direction is formed on the first film, and film thicknesses of the first and second films are adjusted so that the compressive stress and the tensile stress are almost balanced.

18 Claims, 11 Drawing Sheets (Comparative Example)

180
SEMICONDUCTOR DEVICE AND MANUFACTURING METHOD THEREOF

This application is based on Japanese patent application no. 2011-079612, filed Mar. 31, 2011, the entire contents of which is incorporated herein by reference.

BACKGROUND OF THE INVENTION

1. Field of the Invention

The present invention relates to a semiconductor device and a manufacturing method thereof, and more particularly to a semiconductor device having an electrode that penetrates a semiconductor substrate (so called a through silicon (or substrate) via: hereinafter abbreviated as "TSV") and a manufacturing method thereof.

2. Description of the Related Art

Recently, along with the high functionality and diversification of semiconductor devices, a semiconductor device, in which a plurality of semiconductor chips is integrated through vertical stacking of the semiconductor chips, has been proposed. Such a semiconductor device is configured to achieve electrical continuity between the semiconductor chips through the TSV that penetrates a semiconductor substrate of the semiconductor chip.

Since the TSV is formed to penetrate the semiconductor substrate, it is necessary to achieve insulation between the semiconductor substrate and the TSV. Accordingly, it has been proposed to separate the TSV from a semiconductor layer of a device region through an annular insulation separation portion (that is called an insulation ring) around the TSV.

One of methods to separate the TSV from the semiconductor layer includes forming a hole for the TSV from the main surface of the semiconductor substrate, forming an insulating layer on the side wall of the hole and burying the hole which is inside of the insulating layer with a conductive material to form the TSV. In this case, the insulation ring is provided in contact with the TSV.

As another method for forming the insulation ring, there is a method for forming the insulation ring that is isolated from the TSV. In this case, an annular trench is firstly formed from the main surface of the semiconductor substrate and embeds an insulating material in the trench to form the insulation ring. Next, main surface structures including semiconductor elements are formed on the main surface of the semiconductor substrate. Thereafter the thickness of the semiconductor substrate is reduced by back surface grinding or the like so as to expose the bottom part of the insulation ring on the back surface of the semiconductor substrate. A hole for forming the TSV is formed in the region surrounded by the insulation ring from the back surface of the semiconductor substrate and a conductive material is buried in the hole to form the TSV.

The annular trench is necessary to form, for example, with a depth of 40 to 50 μm and with a width of 2 to 3 μm (aspect ratio of 13 to 25), and to additionally bury an insulating film in the trench with good coverage.

As a way to bury the insulating film in the trench, there is a CVD (Chemical Vapor Deposition) method, a SOD (Spin On Dielectric) method, or the like (for example, see JP2009-111061A).

As a CVD method with good coverage, there may be a method of forming a TEOS (tetraethoxysilane)-NSG (Non-doped Silicate Glass) film in a low pressure CVD (LPCVD) method using TEOS and additionally performing thermal densification.

Further, in order to suppress the increase of the aspect ratio of the annular trench, there has been proposed a method of forming a polysilicon film in the annular trench having a wide width with a film thickness not occluded in the trench and performing thermal oxidation on the inside thereof (see JP2008-251964A). According to the forming method of JP2008-251964A, a ring-shaped separation trench (with a width of about 5 μm) is formed in a silicon substrate, and then a polycrystalline silicon film of about 2 μm is conformally formed by the CVD method. Then, a silicon thermal oxide film with a thickness of about 0.8 μm is formed by thermal oxidation of the polycrystalline silicon film. Thereafter, a CVD silicon oxide film is formed by the CVD method to be buried in gaps (see paragraphs [0021] to [0025]). Here, in the process of forming the silicon thermal oxide film of about 0.8 μm from the polycrystalline silicon film, the silicon thermal oxide film is buried with a thickness of about 1.6 μm in accordance with wall on both sides of the trench. In typical thermal oxidation, about a half of the silicon thermal oxide film is formed on the original silicon side, and the remaining half is formed in a direction in which the original silicon is inflated. Accordingly, the gap that remains in the trench has a width of about 200 nm, and the CVD silicon oxide film is buried in the gap.

The CVD silicon oxide film is usually subjected to a thermal densification after deposition and thus thermally-densified CVD silicon oxide film tends to act a tensile stress in the depth direction of the surrounding silicon substrate due to volume shrinkage. If such a CVD silicon oxide film is buried in the whole trench, as illustrated in FIG. 1(a), it has been found that the substrate surrounding the insulation ring may be collapsed by the tensile stress.

On the other hand, the silicon thermal oxide film, which is buried in the trench through oxidation of the silicon by the thermal oxidation method, tends to act a compressive stress in the depth direction of the surrounding silicon substrate by volume expansion. If most of the insulation ring is formed by such a silicon thermal oxide film, as illustrated in FIG. 1(b), the substrate surrounding the insulation ring may be uplifted by the compressive stress. These phenomena may occur, not limited to the case of the insulation ring that is isolated from the TSV, even in a case of the insulation ring formed in contact with the TSV.

As described above, according to the method of forming the insulation ring in the related art, the silicon substrate surrounding the insulation ring may be deformed. Since the insulation ring is provided to achieve electrical insulation between the TSV and the device area, the device area is formed on the outside of the insulation ring, and the TSV is formed on the inside of the insulation ring. Once the silicon substrate surrounding the insulation ring is deformed, the device area on the outside and/or the TSV on the inside may not be properly formed. Accordingly, such deformation of the silicon substrate causes the decrease of production yield.

SUMMARY

According to the present invention, a method of suppressing deformation of a silicon substrate surrounding an insulation ring is provided.

According to an embodiment of the present invention, there is provided a method of manufacturing a semiconductor device, which includes forming a trench on a main surface of a semiconductor substrate; thermally oxidizing a silicon to form a first silicon oxide film in the trench; depositing a second silicon oxide film on the main surface of the semiconductor substrate, the second silicon oxide film having a film thickness that is equal to or greater than a film thickness of the first silicon oxide film; and reducing the thickness of the semiconductor substrate from the back surface that is located on the opposite side of the main surface to expose the bottom of the trench.

According to another embodiment of the present invention, there is provided a semiconductor device, which includes a semiconductor substrate; a trench penetrating the semiconductor substrate; and a sidewall film laminated at least two layers on side walls of the trench, the sidewall film comprising a first film to give a compressive stress to the semiconductor substrate in a depth direction and a second film to give a tensile stress to the semiconductor substrate in the depth direction, the second film having a film thickness that is equal to or greater than a film thickness of the first film.

According to still another embodiment of the present invention, there is provided a semiconductor device, which includes a semiconductor substrate; a trench penetrating the semiconductor substrate; and a sidewall film laminated at least two layers on side walls of the trench, the sidewall film comprising a first silicon oxide film obtained by thermal oxidation of silicon and a second silicon oxide film, the second silicon oxide film having a film thickness that is equal to or greater than a film thickness of the first silicon oxide film.

According to one embodiment of the present invention, the compressive stress due to the first silicon oxide film and the tensile stress due to the second silicon oxide film can offset each other by laminating the first silicon oxide film, which is obtained by thermally oxidizing a layer made of silicon, and the second silicon oxide film, which is deposited by a CVD method or the like, on the side wall of the trench formed on the main surface of the semiconductor substrate.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

(First Exemplary Embodiment)

Figure 1A:
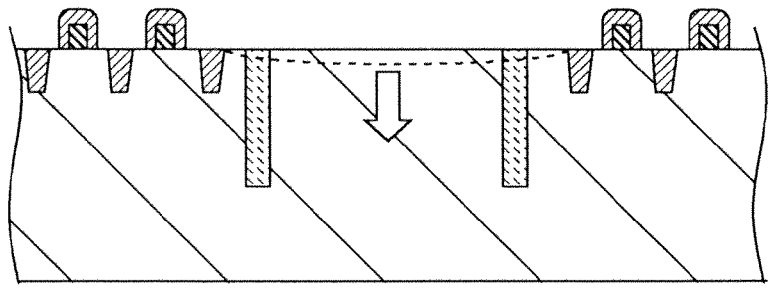
FIGS. 1(a) and 1(b) are conceptual views explaining problems of the background art.
Figure 1B:
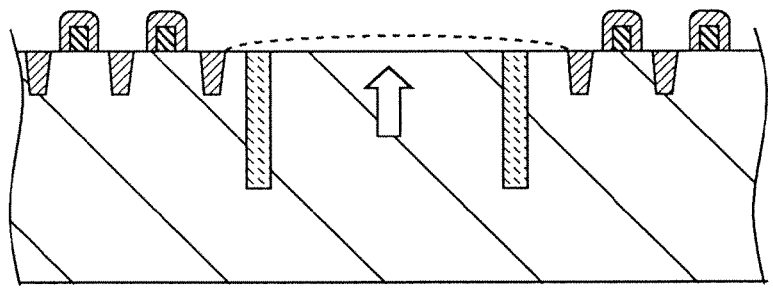
Figure 2:
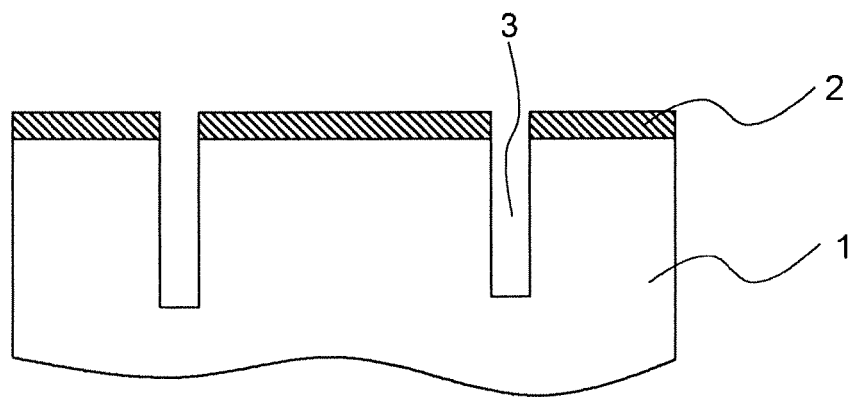
FIGS. 2, 3(a) and 4 to 6 are cross-sectional views illustrating a process for manufacturing a semiconductor device according to one embodiment of the present invention.

First, as illustrated in FIG. 2, an annular (circular ring-shaped) trench 3 is formed on the main surface of a semiconductor substrate (silicon substrate) 1 with a depth of 50 μm and with a width of 2 μm by dry etching. A silicon nitride film 2 that is a mask is formed on the silicon substrate 1, and the ring-shaped opening is formed using a photolithography technique. Then, the silicon substrate is etched using the silicon nitride film 2 as a mask. After the silicon substrate 1 is etched, the silicon nitride film 2 is not removed, but remains as an anti-oxidation film to prevent the oxidation of the surface of the silicon substrate 1. On the other hand, although not illustrated, it is preferable to form a pad silicon oxide film on the surface of the silicon substrate 1 before the silicon nitride film 2 is formed.

Figure 3A:
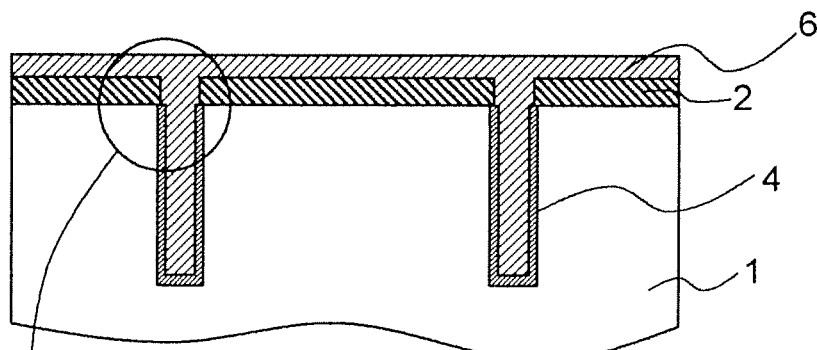
Figure 3B:
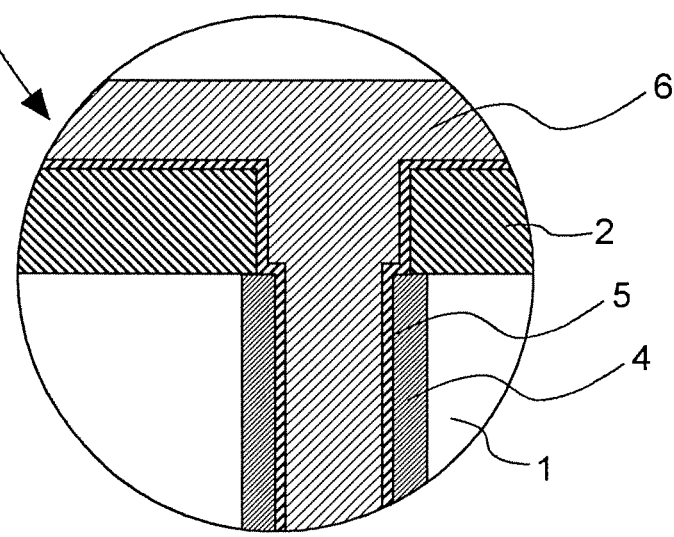
FIG. 3(b) is a partial enlarged view of FIG. 3(a)

Next, as shown in FIGS. 3(a) and 3(b), a first silicon oxide film 4 is formed by thermal oxidation of the inside of the formed trench. In this embodiment, the film thickness of the first silicon oxide film 4 is set to 500 nm in which a compressive stress of the first silicon oxide film 4 is almost balanced with a tensile stress calculated from a film thickness and the amount of film shrinkage of a second silicon oxide film (TEOS-NSG film) 6 that is formed in a later process. Since a silicon thermal oxide film due to the oxidation of Si becomes about 2.27 times the volume of Si, it is possible to apply the compressive stress in the depth direction on the side wall of the ring-shaped trench 3. The film thickness of the first silicon oxide film 4 is adjusted so that the tensile stress given by the second silicon oxide film 6 and the compressive stress of the first silicon oxide film 4 almost offset each other (are balanced) according to the kind of the second silicon oxide film 6, the amount (film thickness) thereof, and the depth or width of the ring-shaped trench 3. In the case of the trench width of 2 μm, it is preferable to form the oxide film with a film thickness of equal to or greater than 300 nm. The thermal oxidation is performed until the silicon thermal oxide film is formed at a temperature of 800 to 1100° C. and with a desired film thickness in a state where the silicon substrate is held at an oxidizing atmosphere. The oxidizing atmosphere can be an atmosphere containing an oxidizing agent, such as oxygen ($O_2$), ozone ($O_3$), carbon monoxide (CO), nitrogen monoxide (NO), water vapor ($H_2O$), or the like. The oxidation by water vapor is preferable since it can form the silicon thermal oxide film with a great film thickness in a relatively short period of time.

Next, considering the use of copper as the TSV, a silicon nitride film 5 (see FIG. 3(b)) (the illustration thereof is omitted in FIGS. 3(a) and 4 to 7) is formed in the ring-shaped trench 3 as a copper barrier film. In this exemplary embodiment, 50 nm is selected as the film thickness of the silicon nitride film 5 as the copper barrier film (the silicon nitride film 5 is called hereinafter a barrier silicon nitride film 5). The width of the ring-shaped trench through the above-described process becomes about 1.5 μm.

Next, using the TEOS as a raw gas, a NSG (Non-doped Silicate Glass) film, which is formed by a low pressure CVD method, is formed with a thickness to be completely buried in the ring-shaped trench as the second silicon oxide film 6. In this embodiment, the TEOS-NSG film is formed with a thickness of 1.76 μm. The film thickness of the second silicon oxide film 6 formed by such a deposition method (the film thickness of the mask silicon nitride film 2) is a film thickness that is equal to or larger than ½ of the trench width of the ring-shaped trench (width of the remaining trench) from the viewpoint that the ring-shaped trench 3 is completely buried, and preferably, is a film thickness that is equal to or larger than the width of the remaining trench. Further, from the viewpoint that it becomes easy to remove the unnecessary second silicon oxide film 6 on the substrate in the later process, it is preferable that the film thickness is equal to or smaller than the trench width (initial width).

The second silicon oxide film 6 is not limited to the TEOS-NSG film, but anyone can also be used as long as it gives the tensile stress through the thermal densification in the later process. In particular, in consideration of burying in a deep ring-shaped trench 3, one of silicon oxide films formed by a CVD method with good coverage or a SOD (Spin On Dielectric) method can be used as the second silicon oxide film 6. The TEOS-NSG film formed by the low pressure CVD method has the advantage that costs of raw materials or manufacturing equipment are cheaper. Typically, the film thickness of the second silicon oxide film 6 (film thickness in a direction that is parallel to the substrate surface in the ring-shaped trench) is equal to or greater than the film thickness of the first silicon oxide film 4 (total film thickness of the first silicon oxide film 4 that faces in a direction parallel to the substrate surface). Preferably, the film thickness of the second silicon oxide film is 1 to 5 times the film thickness of the first silicon oxide film 4, and more preferably, 2 to 4 times the film thickness of the first silicon oxide film 4.

Figure 4:
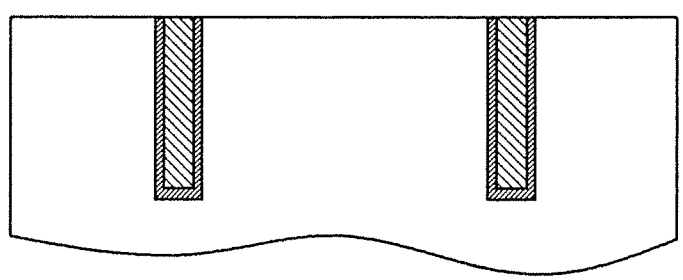

Then, as shown in FIG. 4, the surplus second silicon oxide film 6, the barrier silicon nitride film 5, and the mask silicon nitride film 2 on the silicon substrate 1 are removed by wet etching or a CMP method. For example, the second silicon oxide film 6 and the barrier silicon nitride film 5 are removed by the CMP method using the mask silicon nitride film 2 as a stopper, and then the mask silicon nitride film 2 is removed by wet etching with hot phosphoric acid.

Thereafter, in order to perform the thermal densification of the second silicon oxide film 6 that is buried in the ring-shaped trench, an insulation ring is formed through heat treatment at non-oxidizing atmosphere (inert gas atmosphere such as nitrogen), at 1000° C., for 60 minutes. The thermal densification can be performed in the range of 900 to 1100° C. Although the processing time may differ depending on the processing temperature, the depth and width of the ring-shaped trench, and the like, if about 30 minutes or more, it is possible to perform sufficient thermal densification. The upper limit of the processing time is not particularly limited, and if the thermal densification is performed more than necessary, there is no problem in function of the insulation ring, but energy cost is increased. Typically, it is preferable that the processing time is equal to or shorter than 90 minutes. Further, the thermal densification can be performed before the mask silicon nitride film 2 on the silicon substrate 1 is removed, and in this case, since there is no fear in the oxidization of the silicon substrate, the thermal densification can be performed at oxidizing atmosphere, for example, in air. On the other hand, in the case of the second silicon oxide film 6 formed by the SOD method, it may be necessary to perform heat treatment at oxidizing atmosphere for converting the coated film (for example, polysilazane film) into a silicon oxide film.

Figure 5:
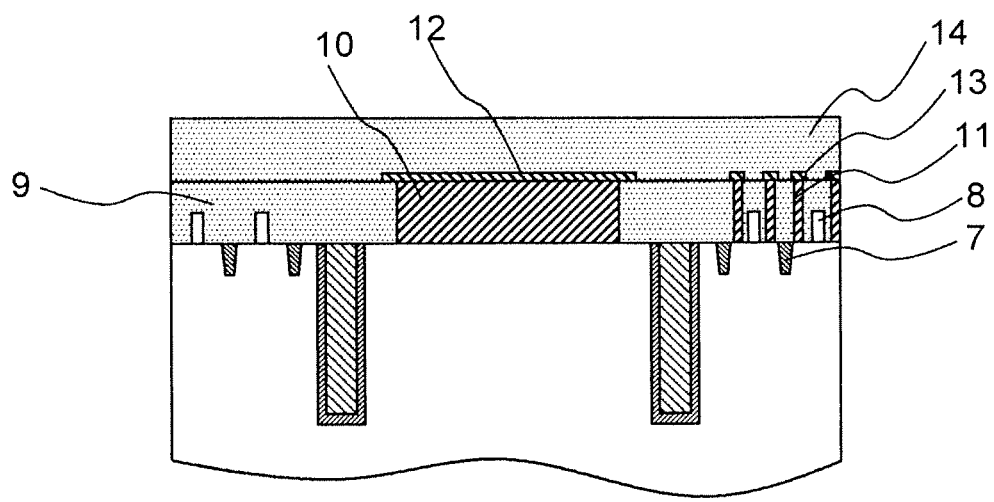

As described above, after finishing the process up to FIG. 4, a conventional element forming process of a semiconductor device is performed. That is, as shown in FIG. 5, formation of a STI (Shallow Trench Isolation) 7 that becomes an element isolation region, formation of a gate electrode 8, and formation of a diffusion layer (not illustrated) are performed.

In addition, a first interlayer insulating film 9 is formed, and a contact electrode 10 for connecting to the TSV to be formed later and a contact plug 11 connected to a diffusion layer of each transistor are formed in the first interlayer insulating film 9. Next, a wiring layer including a wiring 12 connected to the contact electrode 10 and a wiring 13 connected to the contact plug 11 is formed.

Then, a second interlayer insulating film 14 is formed to complete the manufacturing process of the surface side of the silicon substrate.

Thereafter, as described hereinafter, a process of the back surface side of the silicon substrate is performed.

Figure 6:
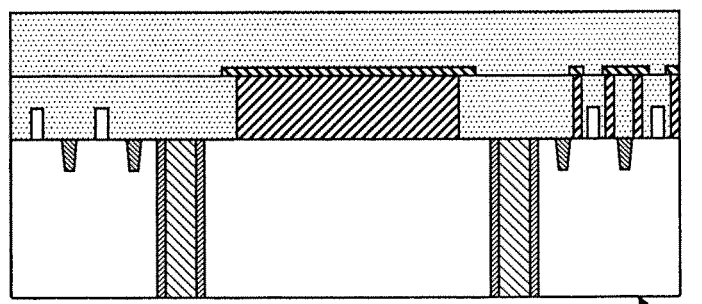

First, a treatment to reduce the thickness of the silicon substrate 1 is performed by, for example, grinding of the back surface thereof. This back surface treatment such as grinding is performed until the bottom part of the insulation ring (trench) is exposed. Through this, as shown in FIG. 6, an insulation ring that penetrates up to the back surface 1B of the silicon substrate 1 is completed. Through this, a TSV forming region that is surrounded by the insulation ring is formed.

Figure 7:
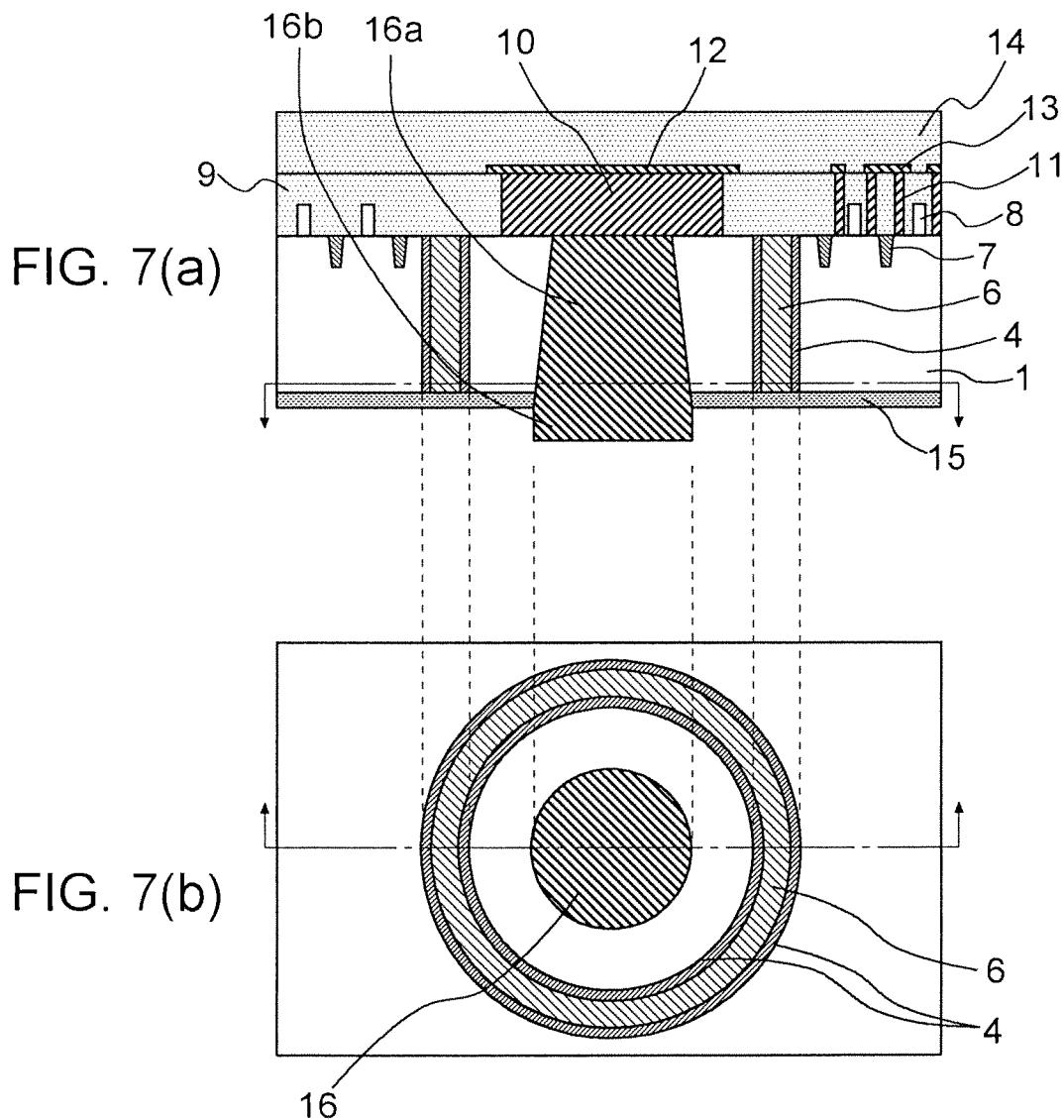
FIG. 7(a) is a vertical cross-sectional view schematically illustrating a semiconductor device according to one embodiment of the present invention.
FIG. 7(b) is a schematic horizontal cross-sectional view.

Next, as shown in FIG. 7, a back surface insulating film 15 that covers the back surface 1B of the silicon substrate (including the TSV forming region) is formed. Then, in the TSV forming region, an opening is formed, which penetrates the back surface insulating film 15 and the silicon substrate 1 from the back surface of the silicon substrate and exposes a lower surface of the connection electrode 10. Next, the TSV 16 is formed to be buried in the opening.

The TSV 16 is formed by forming a seed film by a sputtering method and then embedding copper by a plating method.

For example, first, titanium and copper are sequentially formed on the surface of the insulating layer 15, that is, on the back surface side 1B of the silicon substrate, by a sputtering method or a MOCVD method as the seed film for plating. Next, a photoresist layer is formed (not illustrated). An opening pattern is formed on the photoresist layer by a known lithography method, and copper is buried in the opening by an electroplating method using the opening pattern as a mask.

Thereafter, for example, the photoresist layer is peeled off and removed using an organic solvent such as acetone, and then copper and titanium of the surplus seed film for plating are removed by a wet etching process using hydrofluoric acid or sulfuric acid. Through the above-described process, as shown in FIG. 7, the TSV 16 including an inner TSV 16a and an electrode pad 16b can be formed.

The TSV 16 is made of one kind or two or more kinds of metals such as copper, aluminum, titanium, and tungsten; their alloys, metal silicide such as titanium silicide and tungsten silicide; electric conductive inorganic material such as titanium nitride, and polysilicon containing n-type impurities such as phosphorus or p-type impurities such as boron. It is preferable that the TSV is made of metal such as titanium and copper.

In this exemplary embodiment, as shown in FIG. 7(b), both of the insulation ring and the TSV 16 are formed in a circular shape. However, the shapes thereof are not limited thereto, but can be independently other shapes such as a rectangle.

Further, although the insulation ring is formed as a single ring, it can be multiple rings that are equal to or more than double rings. For example, the insulation ring can include a first insulation ring (insulation separation portion) formed on the TSV side and a second insulation ring (insulation separation portion) formed to be apart from the outer periphery of the first insulation ring through a semiconductor region of the semiconductor substrate. As described above, by making the insulation ring multiple rings, it is possible to ensure the insulation even if the width of each insulation ring is reduced, and by reducing the width of each insulation ring, the compressive stress and the tensile stress acting in the insulation ring become smaller. In this case, even if the stresses do not fully offset each other, but there occurs a slight difference between the stresses, it is possible to reduce the influence on the circumference of the insulation ring. Further, by reducing the width of the trench, the film thicknesses of the first silicon oxide film and the second silicon oxide film that are formed become smaller, and the production yield is improved.

Figure 8:
FIG. 8 is a graph showing the state of surface roughness of a substrate surrounding an insulation ring formed through application of the present invention.

Here, in order to explain the main effect of the present invention, double insulation rings were formed and it was observed how the surface state of the substrate around the insulation rings was changed. Here, as the insulation rings, three sets of double insulation rings with the same depth and width were formed in the same manner to be arranged in a predetermined direction, and the surface roughness of the semiconductor substrate surrounding the insulation ring after the thermal densification was measured by a step contact (probe) measurement. The result of the measurement is shown in FIG. 8.

Figure 9:
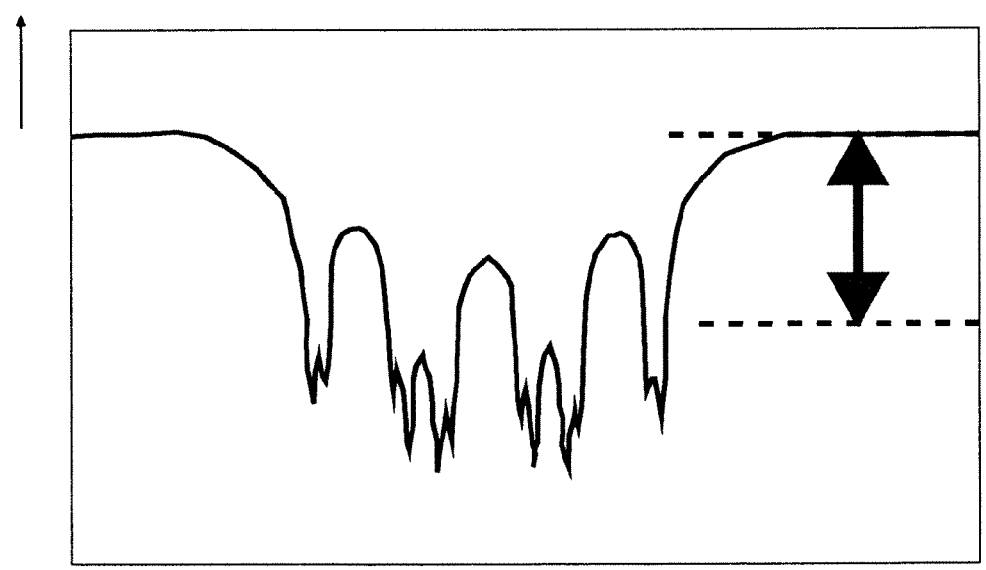
FIG. 9 is a graph showing the state of surface roughness of a substrate surrounding an insulation ring according to a comparative example.

As a comparative example, the insulation rings were formed in the same manner except that the film thickness of the first silicon oxide film (silicon thermal oxide film) 4 was set to 9 to 10 nm, and the roughness of the surface of the semiconductor substrate surrounding the insulation rings was measured. The result of the measurement is shown in FIG. 9. In FIGS. 8 and 9, a horizontal axis represents a length (distance) in a direction that is parallel to the substrate surface, and a vertical axis represents a depth (roughness height) in a direction that is perpendicular to the substrate surface. A difference between roughness heights that are indicated by bold arrows becomes the amount of depression.

In the case of the insulation ring that penetrates the semiconductor substrate, the semiconductor substrate on the back surface side that supports the bottom part of the insulating ring is grinded to be gone, and if a large part of the insulation ring as indicated in the comparative example is formed of the TEOS-NSG film that gives only the tensile stress, stress that is against the tensile stress is almost gone. Accordingly, the insulation ring structure itself may lose the stress of the TEOS-NSG film to be destroyed. In contrast, according to this exemplary embodiment of the present invention, the tensile stress of the TEOS-NSG film is offset by the compressive stress of the silicon thermal oxide film that is formed thicker than the comparative example, and the amount of depression is improved to be equal to or less than about ⅙ to cause no practical problem.

A modified example of the first exemplary embodiment will be now described herein with reference to drawings.

Figure 10A:
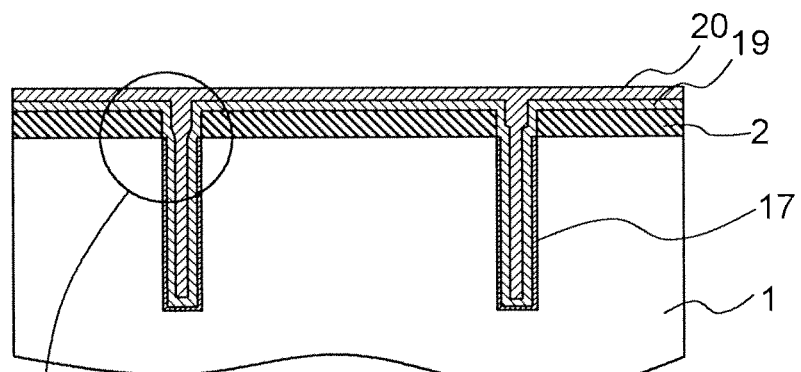
FIG. 10(a) is a cross-sectional view illustrating a process for manufacturing a semiconductor device according to a modified example of one embodiment of the present invention.
Figure 10B:
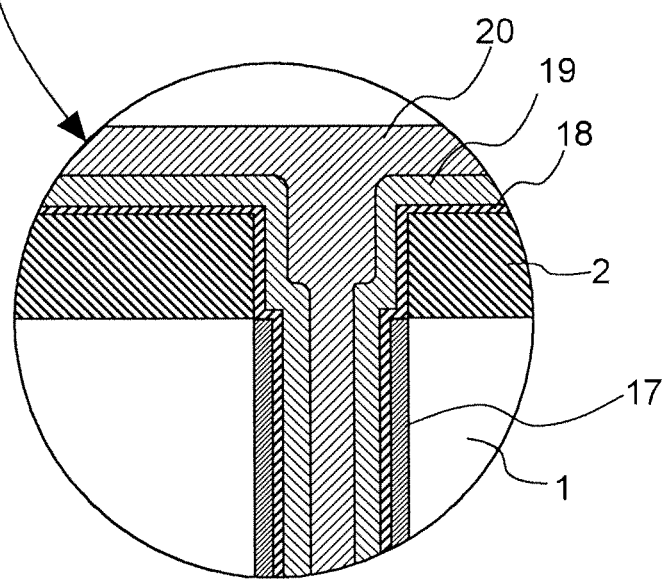
FIG. 10(b) is a partial enlarged view of FIG. 10(a)

FIG. 10(a) is a cross-sectional view illustrating a process for manufacturing a semiconductor device according to a modified example of one embodiment of the present invention, and FIG. 10(b) is a partial enlarged view of FIG. 10(a).

In a similar manner as in the first exemplary embodiment, a ring-shaped trench 3 is formed by selectively etching the main surface of a silicon substrate 1 using a mask silicon nitride film 2 as a mask.

Next, as shown in FIGS. 10(a) and 10(b), a silicon oxide film 17 is formed as a thin film with a thickness, for example, of 9-10 nm, and then a barrier silicon nitride film 18 is deposited by an LPCVD method. On the barrier silicon nitride film 18, a polycrystalline silicon film (not shown) is deposited and then thermally oxidized to form a silicon thermal oxide film 19. At this time, the barrier silicon nitride film 18 prevents the oxidation of the silicon substrate 1. Next, the resultant hole on the inner side of the silicon thermal oxide film 19 is buried with, for example, LP TEOS-NSG film 20. The LP TEOS-NSG film 20, the silicon thermal oxide film 19, the barrier silicon nitride film 18 and the mask silicon nitride film 2 on the surface of the silicon substrate 1 are removed by a CMP method or dry etching method. Thereafter, it is possible to complete a semiconductor device by applying processes in the same way as the first exemplary embodiment.

According to this modified example, the lamination of the silicon thermal oxide film 19 and the LP TEOS-NSG film 20 can set off the compressive stress due to the silicon thermal oxide film 19 with the tensile stress due to the LP TEOS-NSG film 20 so that the deformation of the substrate can be suppressed. In addition, the silicon oxide film 17, which is very thinner than the silicon thermal oxide film 19 and is interposed between the silicon substrate 1 and the silicon thermal oxide film 19, can absorb stresses generated in the silicon substrate 1 so as to suppress the occurrence of cracks in the silicon substrate 1.

(Second Exemplary Embodiment)

A second exemplary embodiment will be now described herein with reference to drawings.

Figure 11A:
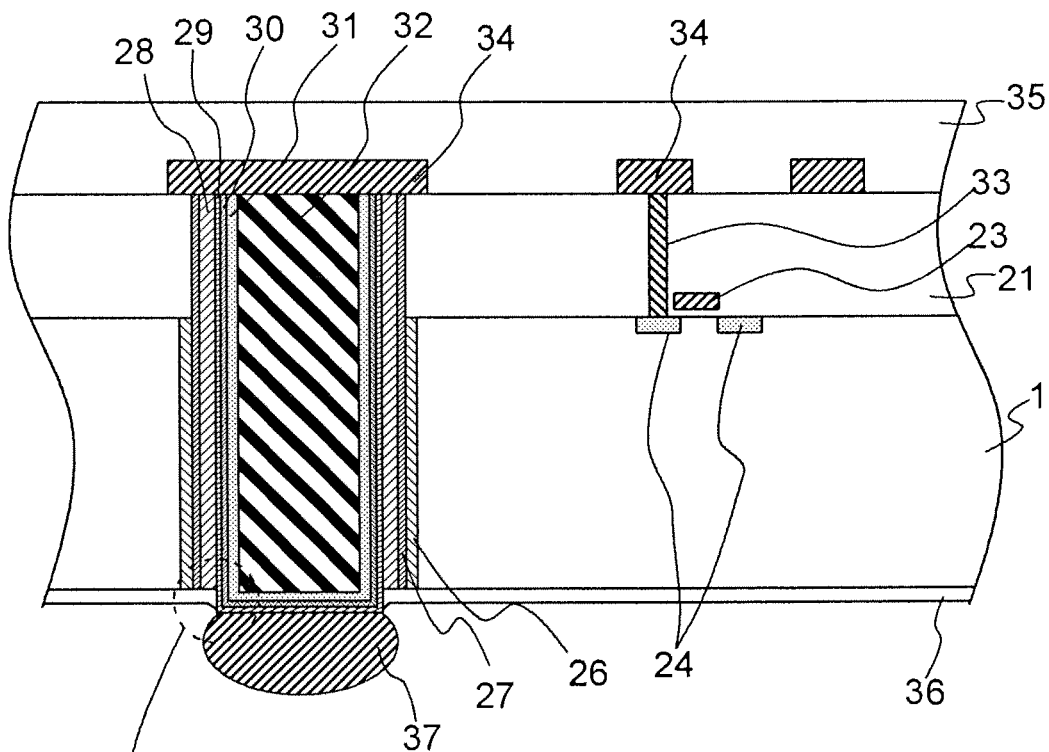
FIG. 11(a) is a cross-sectional view illustrating a semiconductor device according to another embodiment of the present invention.
Figure 11B:
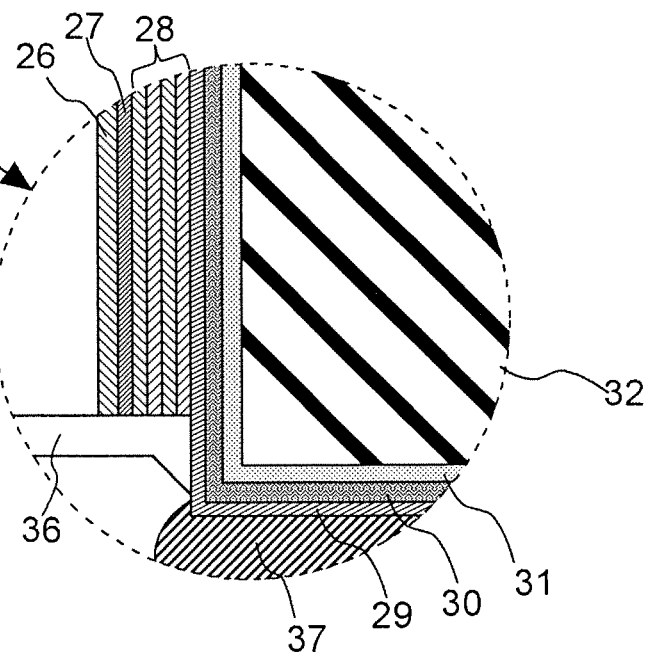
FIG. 11(b) is a partial enlarged view of FIG. 11(a)

FIG. 11(a) is a cross-sectional view illustrating a semiconductor device according to this exemplary embodiment, and FIG. 11(b) is a partial enlarged view of FIG. 11(a). FIGS. 12, 13(a), 14(a) and 15 to 16 are cross-sectional views illustrating a process for manufacturing a semiconductor device according to this exemplary embodiment, and FIGS. 13(b) and 14(b) are partial enlarged views of FIGS. 13(a) and 14(a), respectively.

As shown in FIGS. 11(a) and 11(b), on the main surface of a silicon substrate 1, a MOS transistor including source/drain 24, which are composed of impurity diffusion layers having a conductive type opposite to the silicon substrate 1, and a gate electrode 23 are formed. One of the source/drain 24 is connected to a wiring 34 through a conductive plug 33 formed in an interlayer insulating film 21. The wiring 34 is covered with an insulating film 35. A back surface insulating layer 36 is provided on the back surface of the silicon substrate 1. Silicon nitride and polymer insulating film can be used as the back surface insulating layer 36. A hole for forming a TSV penetrates the silicon substrate 1 and the interlayer insulating film 21 to connect to the wiring 34. On the inner wall of the hole, a thin silicon thermal oxide film 26, a silicon nitride film 27 and a laminated film 28 of CVD silicon oxide films are provided and in their inner side, a TSV, which is composed of an anti-oxidation film 29 such as gold or palladium, an anti-diffusion film 30, a seed layer 31 and a TSV plug 32 composed of copper, is provided. The TSV is electrically connected to the wiring 34. The bottom of the TSV also penetrates the back surface insulating layer 36 provided on the back surface of the silicon substrate 1 to expose on the back surface and a solder bump 37 is formed on the exposed TSV.

According to the second exemplary embodiment, at least two layers including the silicon thermal oxide film 26 obtained by thermally oxidizing the silicon substrate 1 as a first film and the laminated film 28 of CVD silicon oxide films as a second film are provided on the side wall of the hole for forming the TSV so that it can be set off the compressive stress due to the silicon thermal oxide film 26 with the tensile stress due to the laminated film 28. The CVD silicon oxide film is not a thick film which is formed in a single deposition as in the first exemplary embodiment. Instead the CVD silicon oxide film is configured as a laminated film divided into very thin films. Therefore, the magnitude ofthe tensile stress due to the CVD silicon oxide films can be remarkably reduced by such a laminated film configuration. In addition, the compressive stress, which balances the reduced tensile stress, can be also reduced so that the thinner silicon thermal oxide film, which generates the compressive stress, can be used. The laminated film of very thin films can provide a totally thick film while suppressing the increase of stress. Such a thick film configuration can reduce the parasitic capacitance due to the TSV and contributes to the improvement of signal transmission performance. To form the laminated film in addition to heat treatment for each deposition, a large stress reduction can be obtained. That is, the second film is preferably a laminated film of at least two silicon oxide films that are respectively thermally densified. In the example shown in FIG. 11, the laminated film 28 is illustrated as the lamination of 4 layers (see, FIG. 11(b)).

Next, the manufacturing processes of the semiconductor device according to this exemplary embodiment will be described herein with reference to drawings.

Figure 12:
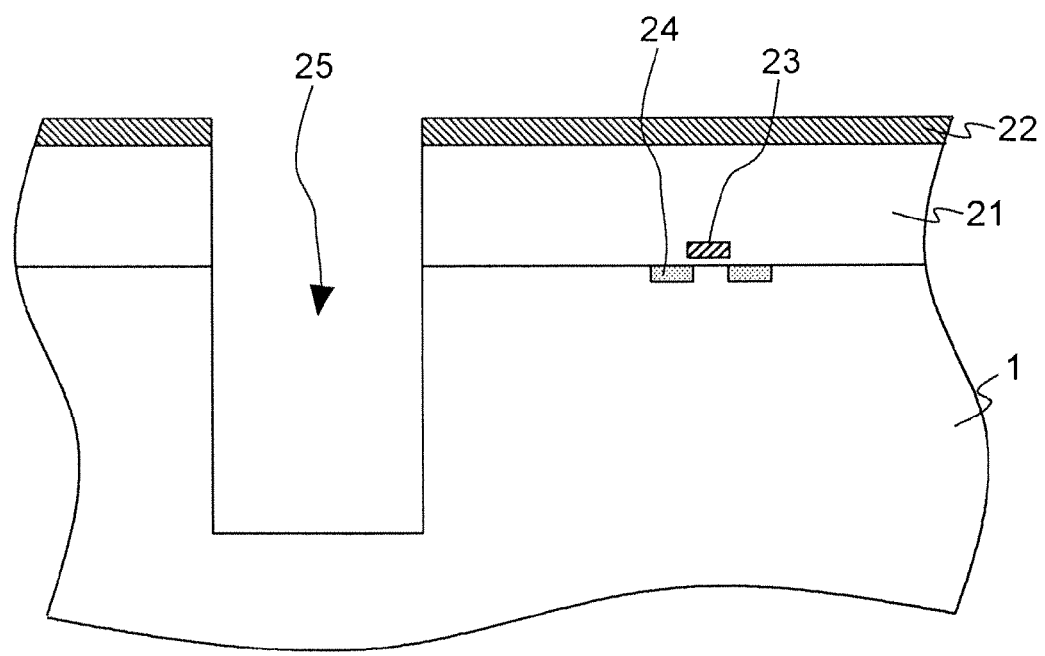
FIGS. 12, 13(a), 14(a) and 15 to 16 are cross-sectional views illustrating a process for manufacturing a semiconductor device according to another embodiment of the present invention.

As shown in FIG. 12, an element configured with the semiconductor device is formed on the main surface of the silicon substrate 1 and then the interlayer insulating film 21 is deposited thereon. In this figure, a MOS transistor composed of source/drain 24 and the gate electrode 23 is schematically illustrated as the element configured with the semiconductor device. The interlayer insulating film 21 and the silicon substrate 1 are selectively etched using a mask silicon nitride film 22 to form a hole 25 for forming the TSV.

Figure 13A:
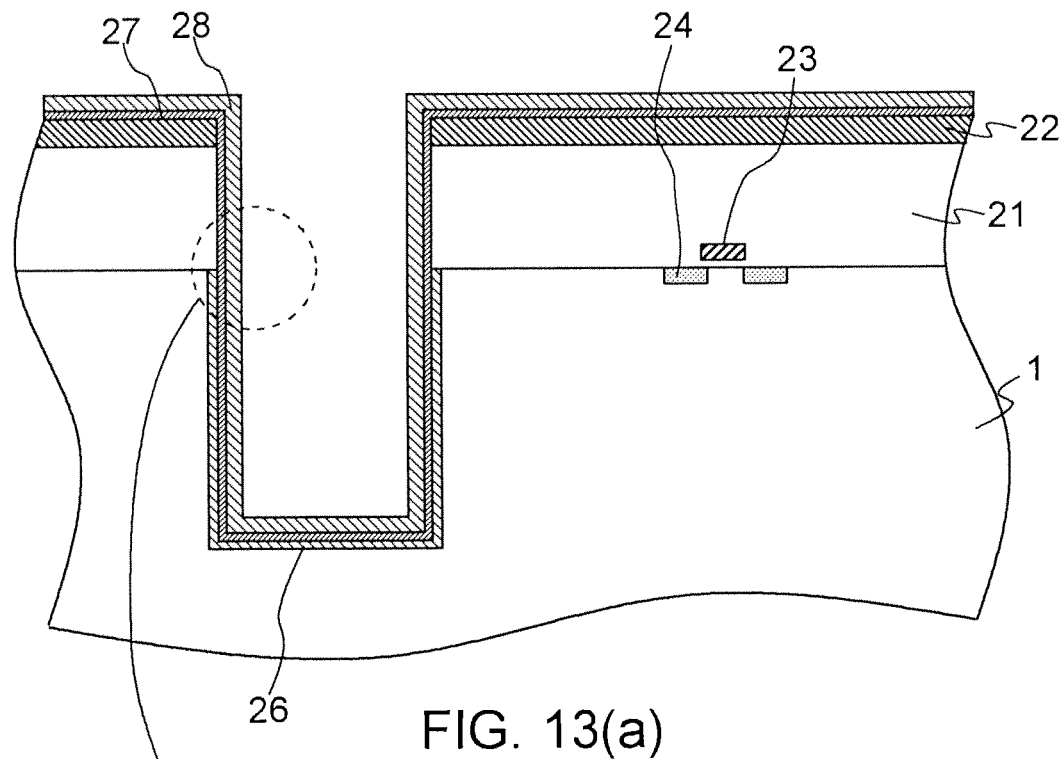
Figure 13B:
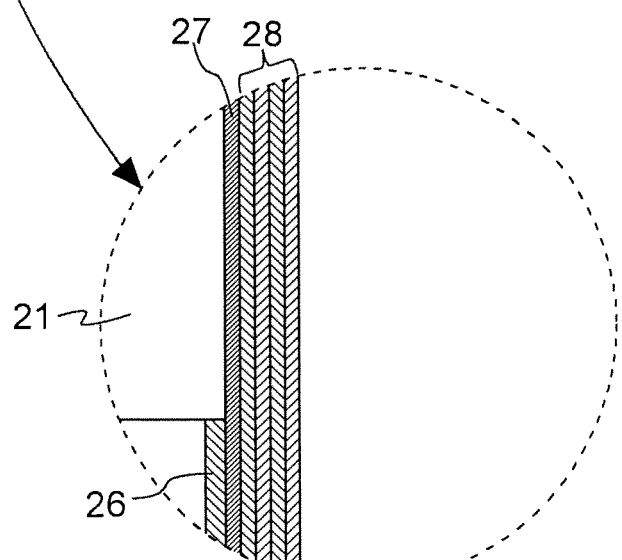
FIGS. 13(b) and 14(b) are partial enlarged views of FIGS. 13(a) and 14(a), respectively.

As shown in FIGS. 13(a) and 13(b), the silicon substrate 1 exposed as the inner wall of the hole 25 is thermally oxidized to produce a thermal silicon oxide film 26. Sequentially, a silicon nitride film 27 is deposited by a CVD method. Further, a laminated film 28 of LP CVD silicon oxide films is formed on the silicon nitride film 27. At this time, a cycle of deposition by the CVD method and subsequent heat treatment is repeated at least two times.

Figure 14A:
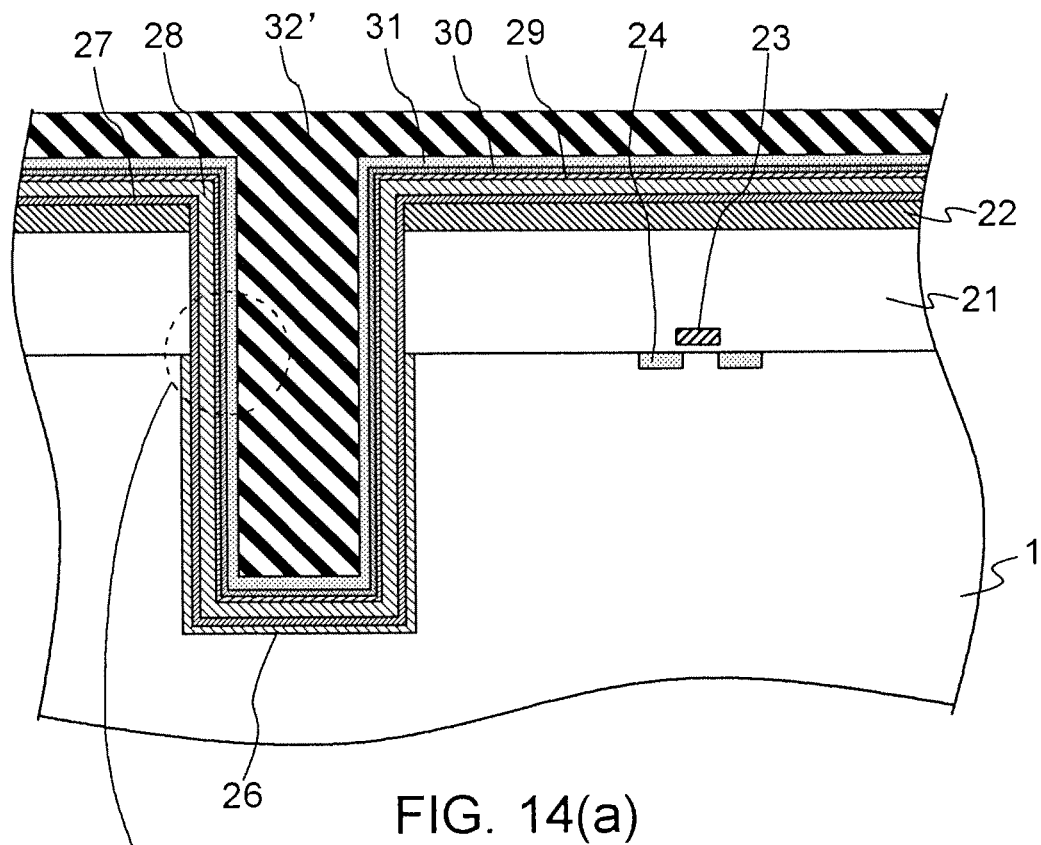
Figure 14B:
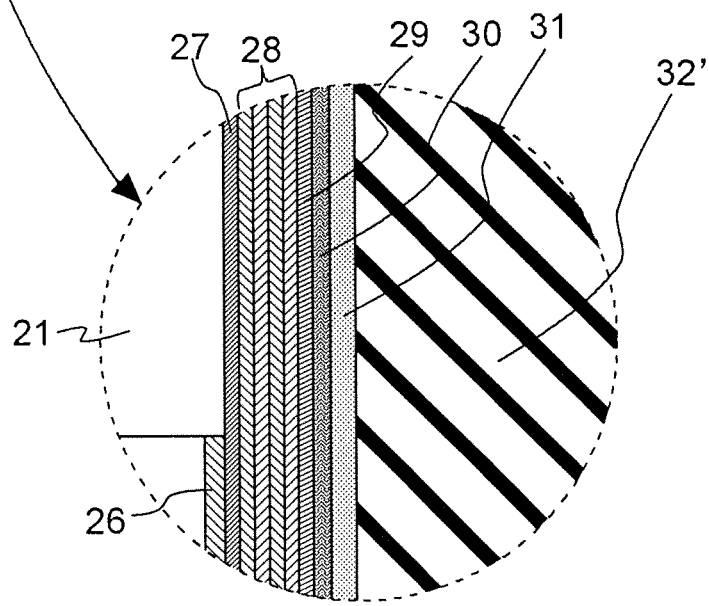

As shown in FIGS. 14(a) and 14(b), an anti-oxidation film 29, an anti-diffusion film 30 and seed layer 31 are deposited in this order on the laminated film 28 of LP CVD silicon oxide films. Next, a copper plating film 32' for the TSV plug 32 is deposited by an electroplating method.

Figure 15:
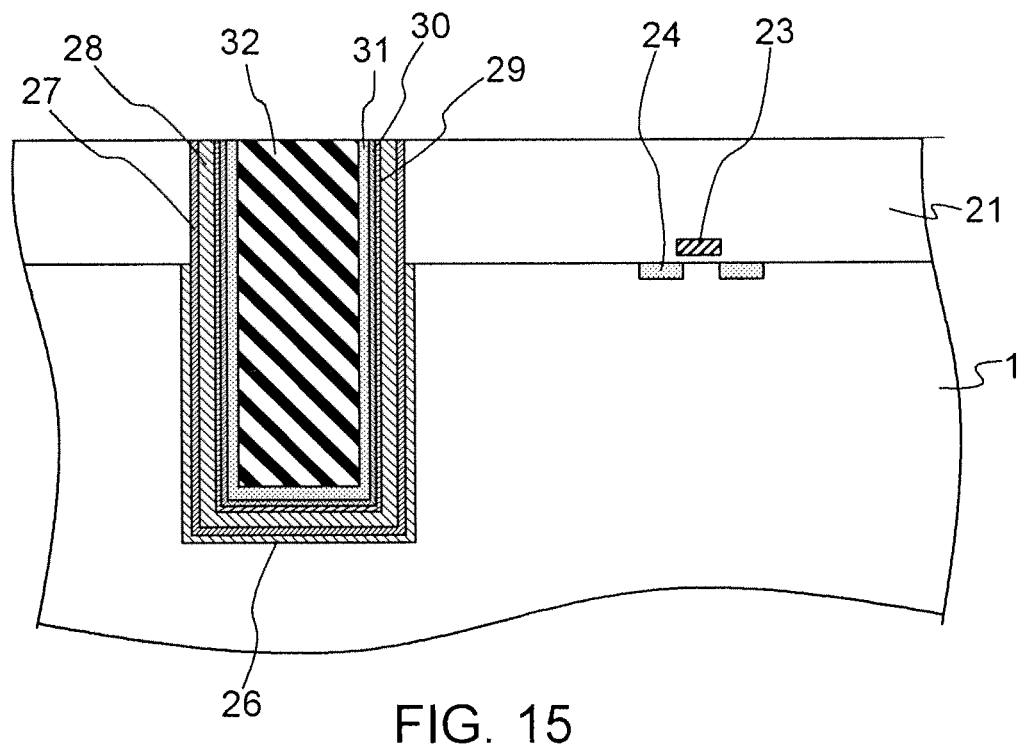

As shown in FIG. 15, the mask silicon nitride film 22, the silicon nitride film 27, the laminated film 28 of LP CVD silicon oxide films, the anti-oxidation film 29, the anti-diffusion film 30, the seed layer 31 and the copper plating film 32' on the interlayer insulating film 21 are removed by a CMP method or dry-etching method. As a result, a TSV component including the TSV plug 32 is formed in the hole 25 for forming the TSV.

Figure 16:
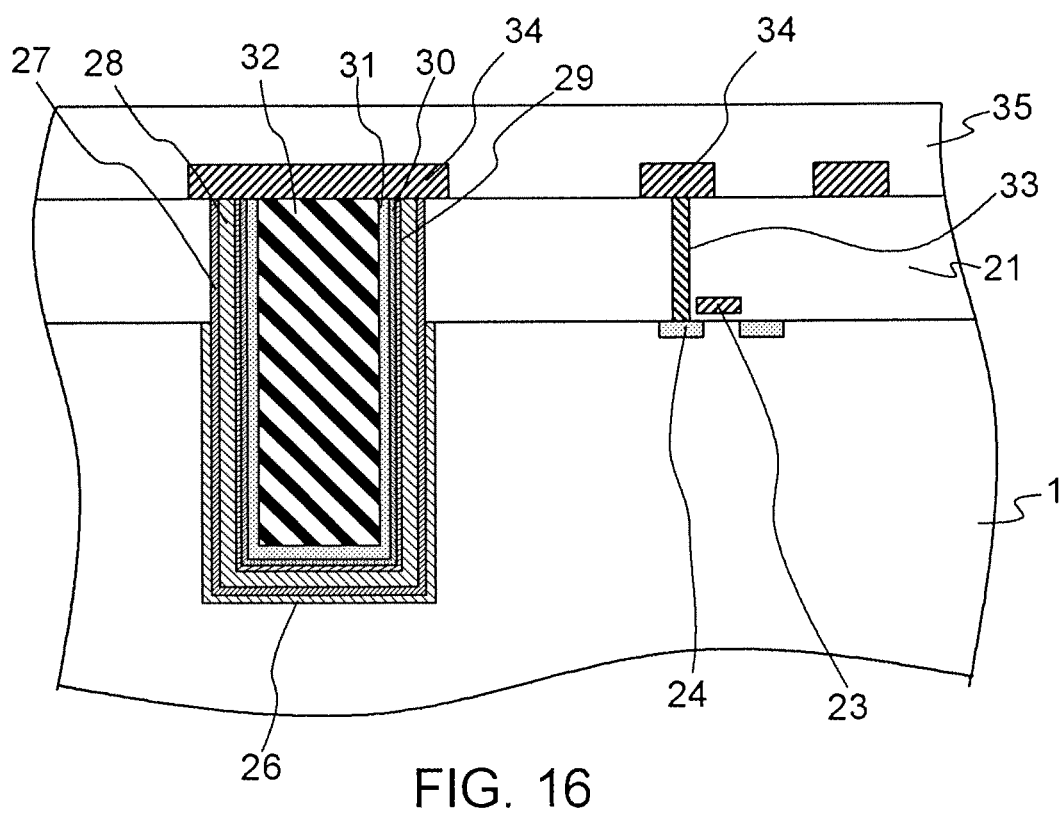

As shown in FIG. 16, a contact plug 33 is formed in the interlayer insulating film 21 and wirings 34 are formed on the interlayer insulating film 21. A part of the interlayer insulating film 21 is electrically connected to the TSV component. Sequentially, an insulating film 35 is deposited thereon. Thereafter, the thickness of the silicon substrate 1 is reduced by grinding and etching from the back surface of the silicon substrate 1 so as to expose the bottom portion of the TSV component. A silicon nitride film is deposited on the back surface of the silicon substrate 1 as a back surface insulating layer 36 and then the bottom portion of the TSV component is exposed again. A solder bump 37 is formed on the exposed TSV component to complete the semiconductor device shown in FIG. 11.

What is claimed is:

1. A method of manufacturing a semiconductor device comprising:
   forming a trench on a main surface of a semiconductor substrate;
   thermally oxidizing silicon to form a first silicon oxide film in the trench;
   depositing a second silicon oxide film on the main surface of the semiconductor substrate; and
   reducing a thickness of the semiconductor substrate from a back surface that is located on a opposite side of the main surface to expose a bottom of the trench, wherein:
   the first silicon oxide film gives a compressive stress to the semiconductor substrate in a depth direction;
   the second silicon oxide film gives a tensile stress to the semiconductor substrate in the depth direction; and
   the second silicon oxide film has the film thickness so that the tensile stress is substantially balanced out by the compressive stress of the first silicon oxide film.

2. The method of manufacturing a semiconductor device according to claim 1, wherein the trench is formed in a hole shape and the method further comprises forming an electrode in a concavity located within an interior of the first and second silicon oxide films formed in the trench, the electrode being formed so as to be penetrating the semiconductor substrate after reducing the thickness of the semiconductor substrate.

3. The method of manufacturing a semiconductor device according to claim 1, wherein the depositing the second silicon oxide film comprises repeating a cycle of a deposition of the second silicon oxide film and a subsequent heat treatment at least two times.

4. The method of manufacturing a semiconductor device according to claim 1, wherein a film thickness of the second silicon oxide film in a direction parallel to the main surface of the semiconductor substrate is 1 to 5 times the film thickness of the first silicon oxide film in the same direction.

5. The method of manufacturing a semiconductor device according to claim 1, wherein a film thickness of the second silicon oxide film in the direction parallel to the main surface of the semiconductor substrate is 2 to 4 times the film thickness of the first silicon oxide film in the same direction.

6. The method of manufacturing a semiconductor device according to claim 1, wherein the second silicon oxide film is formed by a CVD method.

7. The method of manufacturing a semiconductor device according to claim 6, wherein the second silicon oxide film is a non-doped silicate glass formed by a low pressure CVD method with a TEOS as a raw material.

8. The method of manufacturing a semiconductor device according to claim 1, further comprising performing a heat treatment to the semiconductor substrate after depositing the second silicon oxide film.

9. The method of manufacturing a semiconductor device according to claim 8, wherein the heat treatment is performed in the range of 900 to 1100° C. at non-oxidizing atmosphere.

10. The method of manufacturing a semiconductor device according to claim 1, the method further comprises forming a silicon nitride film before depositing the second silicon oxide film.

11. The method of manufacturing a semiconductor device according to claim 1, wherein the second silicon oxide film is a laminated film of a plurality of silicon oxide layers.

12. A method of manufacturing a semiconductor device comprising:

forming a hole on a main surface of a semiconductor substrate, the semiconductor substrate including silicon;

forming a first silicon oxide film on a sidewall of the hole by thermally oxidizing the silicon of the side wall of the hole;

depositing a second silicon oxide film on the sidewall of the hole; and reducing a thickness of the semiconductor substrate from a back surface that is located on an opposite side of the main surface to expose a bottom of the hole, wherein:

the first silicon oxide film gives a compressive stress to the semiconductor substrate in a depth direction;

the second silicon oxide film gives a tensile stress to the semiconductor substrate in the depth direction; and the second silicon oxide film has the film thickness so that the tensile stress is substantially balanced out by the compressive stress of the first silicon oxide film.

13. The method of manufacturing a semiconductor device according to claim 12, the method further comprises forming an electrode in a concavity located within an interior of the first and second silicon oxide films formed in the hole, the electrode being formed so as to be penetrating the semiconductor substrate after reducing the thickness of the semiconductor substrate.

14. The method of manufacturing a semiconductor device according to claim 12, wherein the depositing the second silicon oxide film comprises repeating a cycle of a depositing of the second silicon oxide film and a subsequent heat treatment at least two times.

15. The method of manufacturing a semiconductor device according to claim 12, wherein a film thickness of the second silicon oxide film in a direction parallel to the main surface of the semiconductor substrate is 1 to 5 times the film thickness of the first silicon oxide film in the same direction.

16. The method of manufacturing a semiconductor device according to claim 12, wherein a film thickness of the second silicon oxide film in a direction parallel to the main surface of the semiconductor substrate is 2 to 4 times the film thickness of the first silicon oxide film in the same direction.

17. The method of manufacturing a semiconductor device according to claim 12, further comprising performing a heat treatment to the semiconductor substrate after depositing the second silicon oxide film.

18. The method of manufacturing a semiconductor device according to claim 12, wherein the second silicon oxide film is a laminated film of a plurality of silicon oxide layers.

* * * * *